United States Patent
Kodera et al.

(10) Patent No.: US 10,329,394 B2
(45) Date of Patent: Jun. 25, 2019

(54) RESIN COMPOSITE, FILM, METHODS OF PRODUCING THE RESIN COMPOSITE AND THE FILM, MOLDED PRODUCT, AND ARTICLE

(71) Applicant: KURARAY CO., LTD., Kurashiki-shi (JP)

(72) Inventors: Jumpei Kodera, Tainai (JP); Kaori Maeda, Tainai (JP); Noboru Higashida, Tainai (JP)

(73) Assignee: KURARAY CO., LTD., Kurashiki-shi (JP)

( * ) Notice: Subject to any disclaimer, the term of this patent is extended or adjusted under 35 U.S.C. 154(b) by 70 days.

(21) Appl. No.: 15/554,946

(22) PCT Filed: Mar. 3, 2016

(86) PCT No.: PCT/JP2016/001170
§ 371 (c)(1),
(2) Date: Aug. 31, 2017

(87) PCT Pub. No.: WO2016/139950
PCT Pub. Date: Sep. 9, 2016

(65) Prior Publication Data
US 2018/0030223 A1    Feb. 1, 2018

(30) Foreign Application Priority Data

Mar. 5, 2015  (JP) ................. 2015-043593
Mar. 10, 2015  (JP) ................. 2015-047535

(51) Int. Cl.
| | | |
|---|---|---|
| C08L 33/12 | (2006.01) | |
| C08L 53/00 | (2006.01) | |
| C08J 5/18 | (2006.01) | |
| B29C 48/08 | (2019.01) | |
| C08F 120/14 | (2006.01) | |
| C08F 297/02 | (2006.01) | |
| B29K 33/00 | (2006.01) | |
| C23C 14/02 | (2006.01) | |
| C23C 14/20 | (2006.01) | |

(52) U.S. Cl.
CPC ............ *C08J 5/18* (2013.01); *C08F 120/14* (2013.01); *C08F 297/026* (2013.01); *C08L 33/12* (2013.01); *C08L 53/00* (2013.01); *B29C 48/08* (2019.02); *B29K 2033/12* (2013.01); *C08J 2333/12* (2013.01); *C08L 2201/10* (2013.01); *C08L 2203/16* (2013.01); *C08L 2205/025* (2013.01); *C23C 14/02* (2013.01); *C23C 14/20* (2013.01)

(58) Field of Classification Search
CPC .................................. C08L 33/12; C08L 53/00
See application file for complete search history.

(56) References Cited

U.S. PATENT DOCUMENTS

| | | |
|---|---|---|
| 2003/0191243 A1 | 10/2003 | Hamada et al. |
| 2004/0106732 A1 | 6/2004 | Tsuji et al. |
| 2004/0147674 A1 | 7/2004 | Kakeda et al. |
| 2009/0105396 A1 | 4/2009 | Fujihara et al. |
| 2011/0218303 A1 | 9/2011 | Oshima et al. |
| 2013/0217827 A1 | 8/2013 | Ozawa et al. |
| 2015/0299449 A1 | 10/2015 | Ozawa et al. |
| 2017/0158830 A1 | 6/2017 | Maeda et al. |

FOREIGN PATENT DOCUMENTS

| | | |
|---|---|---|
| EP | 2 634 214 A1 | 9/2013 |
| EP | 3 075 780 A1 | 10/2016 |
| JP | 56-27378 B2 | 6/1981 |
| JP | 10-168271 A | 6/1998 |
| JP | 2002-080678 | 3/2002 |
| JP | 2003-277574 A1 | 10/2003 |
| JP | 2012-213911 A | 11/2012 |
| JP | 2013-23599 A | 2/2013 |
| JP | 2013-43964 A | 3/2013 |
| JP | WO 2014/073216 | 5/2014 |
| WO | WO 02/081561 A1 | 10/2002 |
| WO | WO 02/092696 A1 | 11/2002 |
| WO | WO 2010/055798 A1 | 5/2010 |
| WO | WO 2012/057079 A1 | 5/2012 |

(Continued)

OTHER PUBLICATIONS

International Search Report dated May 10, 2016 in PCT/JP2016/001170 filed Mar. 3, 2016.

(Continued)

*Primary Examiner* — Vu A Nguyen
(74) *Attorney, Agent, or Firm* — Oblon, McClelland, Maier & Neustadt, L.L.P.

(57) ABSTRACT

A resin composite, a method of producing the resin composite, a molded product, a film, and an article excellent in impact resistance are provided. The resin composite contains a methacrylic resin (A), which contains no less than 80% by mass of a structural unit derived from methyl methacrylate and has a melt viscosity $\eta(A)$ of 1500 to 3500 Pa·s at 220° C. and a shear rate of 122/sec, and a triblock copolymer (B), which has a methacrylic acid ester polymer block (b2) coupled to each of two ends of an acrylic acid ester polymer block (b1), at a specific ratio. The triblock copolymer (B) includes the block (b1) and the block (b2) at a specific ratio and has a melt viscosity $\eta(B)$ of 75 to 1500 Pa·s at 220° C. and a shear rate of 122/sec. The ratio of $\eta(A)/\eta(B)$ is from 1 to 20.

14 Claims, No Drawings

(56) References Cited

FOREIGN PATENT DOCUMENTS

| WO | WO 2014/002506 A1 | 1/2014 | |
|---|---|---|---|
| WO | WO 2015/076398 A1 | 5/2015 | |
| WO | WO-2015076398 A1 * | 5/2015 | ................ C08J 5/18 |

OTHER PUBLICATIONS

Extended Search Report dated Oct. 2, 2018 in European Patent Application No. 16758646.0.

Extended European Search Report dated Oct. 15, 2018 in Patent Application No. 16771794.1 (which is a corresponding U.S. Appl. No. 15/562,040).

Office Action dated Dec. 10, 2018 in co-pending U.S. Appl. No. 15/562,040.

* cited by examiner

RESIN COMPOSITE, FILM, METHODS OF PRODUCING THE RESIN COMPOSITE AND THE FILM, MOLDED PRODUCT, AND ARTICLE

TECHNICAL FIELD

The present invention relates to a resin composite that includes a methacrylic resin (A) and a triblock copolymer (B) and to a method of producing the resin composite. The present invention also relates to a molded product that includes a molding formed of the resin composite, a film that includes a layer composed of the resin composite, a method of producing the film, and an article.

BACKGROUND ART

A methacrylic resin excels in such optical properties as transparency and in weatherability, and a molded product of the methacrylic resin has an aesthetic appearance. Thus, to date, such a molded product has been used in a variety of applications, including lighting equipment, indication members such as a signboard, optical members such as a display component, interior design members, construction members, electronic and electric members, and medical members. However, a methacrylic resin is a brittle material, and thus it has been difficult to use an unprocessed methacrylic resin in the applications requiring flexibility, flex resistance, impact resistance, or the like. In particular, when a methacrylic resin is used for a film, a film consisting only of a methacrylic resin is very brittle and sometimes experiences such problems as breakage when the film is transported during the manufacture thereof, when passed through an accumulator, when trimmed, when taken up, when cut after being taken up, when transported to be processed, when put into a secondary process through thermoforming, when trimmed to have an unnecessary portion removed after thermoforming, or when affixed to another base film.

Thus, in order to improve the brittleness of a film consisting only of a methacrylic resin, a method in which various types of materials are alloyed or blended has being proposed. Patent Literature 1 proposes an acryl-based resin film in which core-shell-type particles are blended. Meanwhile, Patent Literature 2 proposes an acryl-based resin film in which a polyvinyl acetal resin is alloyed. Patent Literature 3 proposes a polymer composite that contains, at a specific ratio, a thermoplastic resin (a) and a block copolymer (b) that includes, in the molecules, at least one structure in which a highly syndiotactic polymethacrylic acid alkyl ester block is coupled to each of two ends of a polyacrylic acid alkyl ester block. Furthermore, Patent Literature 4 discloses a resin composite that includes a block copolymer having an acrylic acid ester polymer block containing a specific amount of a structural unit derived from an acrylic acid alkyl ester and a specific amount of a structure derived from a (meth)acrylic acid aromatic ester. In addition, Patent Literature 5 discloses an acryl-based resin composite obtained by blending 0.3 to 3 parts by mass of a polymer processing aid (B) with 100 parts by mass of an acryl-based block copolymer (A).

CITATION LIST

Patent Literature

Patent Literature 1: Japanese Examined Patent Application Publication No. S56-27378

Patent Literature 2: Japanese Unexamined Patent Application Publication No. 2013-23599

Patent Literature 3: Japanese Unexamined Patent Application Publication No. H10-168271

Patent Literature 4: International Patent Publication No. WO2014/073216

Patent Literature 5: Japanese Unexamined Patent Application Publication No. 2013-43964

SUMMARY OF INVENTION

Technical Problem

Various properties including the brittleness of a methacrylic resin can be improved according to Patent Literatures 1 to 5 described above. However, nowadays, the required performance of a resin composite is high, and a highly sophisticated design is demanded. In addition, there is a demand for a resin composite having a plurality of properties in a well-balanced manner for use in a molded product, a film, an article, and so on. Specifically, there is a need for a resin composite that has high transparency, excels in surface hardness, and excels in surface smoothness, and in the field of optical applications in particular, a resin composite that experiences less whitening when being heated is needed. Furthermore, a material with high impact resistance is needed.

The present invention has been made in view of the above background and is directed to providing a resin composite that excels in transparency, surface hardness, and surface smoothness and that experiences less whitening when being heated and a method of producing such a resin composite and providing a molded product, a film, and an article that are composed of such a resin composite and that excel in impact resistance.

Solution to Problem

The present inventors have conducted diligent examinations and have completed the invention that encompasses the following aspects.

[1] A resin composite includes 65 to 99 parts by mass of a methacrylic resin (A) that contains no less than 80% by mass of a structural unit derived from methyl methacrylate and that has a melt viscosity $\eta(A)$ of 1500 to 3500 Pa·s at 220° C. and at a shear rate of 122/sec; and 1 to 35 parts by mass of a triblock copolymer (B) in which a methacrylic acid ester polymer block (b2) is coupled to each of two ends of an acrylic acid ester polymer block (b1), wherein the triblock copolymer (B) includes 30% to 60% by mass of the acrylic acid ester polymer block (b1) and 40% to 70% by mass of the methacrylic acid ester polymer block (b2), and the triblock copolymer (B) has a melt viscosity $\eta(B)$ of 75 to 1500 Pa·s at 220° C. and at a shear rate of 122/sec, and a ratio $\eta(A)/\eta(B)$ of the melt viscosity $\eta(A)$ to the melt viscosity $\eta(B)$ is from 1 to 20.

[2] The resin composite according to [1], wherein when a mass percentage of the triblock copolymer (B) is 100, the methacrylic acid ester polymer blocks (b2) coupled to the respective ends of the acrylic acid ester polymer block (b1) have different mass percentages, and when the block with a higher mass percentage is designated by (b2(H)) and the block with a lower mass percentage is designated by (b2(L)), the ratio of the mass percentage of (b2(H)) to the mass percentage of the block (b2(L)) in the triblock copolymer (B), (b2(H))/(b2(L)), is no less than 1.3.

[3] The resin composite according to [1] or [2] further includes, with respect to 100 parts by mass of the resin composite, 0.3 to 3 parts by mass of a processing aid that is composed of no less than 60% by mass of a methyl methacrylate unit and no greater than 40% by mass of a vinyl-based monomer unit that can be copolymerized with methyl methacrylate, and the processing aid has a mean degree of polymerization of 3,000 to 40,000.

[4] A molded product that includes a molding formed of the resin composite according to any one of [1] to [3].

[5] A film that includes at least a resin film (R) formed of the resin composite according to any one of [1] to [3].

[6] The film according to [5], wherein a haze of the resin film (R) is no greater than 0.7%.

[7] The film according to [5] or [6], wherein a surface roughness of at least one surface of the resin film (R) is no greater than 2.5 nm.

[8] The film according to any one of [5] to [7], wherein a pencil hardness of at least one surface of the resin film (R) is no lower than HB.

[9] The film according to any one of [5] to [8], wherein an impact resistance of the resin film (R) is no lower than 40 mJ.

[10] The film according to any one of [5] to [9], wherein printing is performed on at least one surface of the resin film (R).

[11] The film according to any one of [5] to [10], wherein at least one of (i) a layer made of metal and/or metal oxide, (ii) a thermoplastic resin layer, and (iii) a base material layer is laminated on at least one surface of the resin film (R).

[12] An article on a surface of which the film according to any one of [5] to [11] is provided.

[13] A method of producing a resin composite, and the method includes a step of obtaining a methacrylic resin (A) that contains no less than 80% by mass of a structural unit derived from methyl methacrylate and that has a melt viscosity η(A) of 1500 to 3500 Pa·s at 220° C. and at a shear rate of 122/sec;

a step of obtaining a triblock copolymer (B) in which a methacrylic acid ester polymer block (b2) is coupled to each of two ends of an acrylic acid ester polymer block (b1), the triblock copolymer (B) containing 30% to 60% by mass of the acrylic acid ester polymer block (b1) and 40% to 70% by mass of the methacrylic acid ester polymer block (b2), the triblock copolymer (B) having a melt viscosity η(B) of 75 to 1500 Pa·s at 220° C. and at a shear rate of 122/sec; and a step of melt-compounding a resin composite that contains 65 to 99 parts by mass of the methacrylic resin (A) and 1 to 35 parts by mass of the triblock copolymer (B), wherein a ratio η(A)/η(B) of the melt viscosity η(A) to the melt viscosity η(B) is from 1 to 20, and the step of melt-compounding is carried out at a shear rate of 10/sec to 1000/sec and at a temperature of from 180° C. to 300° C.

[14] A method of producing a film by extruding the resin composite according to any one of [1] to [3] from a T-die and pinching the resin composite by a mirror finish roll or belt, wherein a surface temperature of the mirror finish roll or belt is from 60° C. to 130° C.

Advantageous Effects of Invention

The present invention has an advantageous effect that a resin composite that excels in transparency, surface hardness, and surface smoothness and that experiences less whitening when being heated and a method of producing such a resin composite, and a molded product, a film, and an article that are composed of such a resin composite and that excel in impact resistance are provided.

DESCRIPTION OF EMBODIMENTS

Hereinafter, an example of embodiments to which the present invention is applied will be described. It is to be noted that the numerical values specified in the present specification are the values obtained when the measurements are carried out through the methods illustrated in the examples that will be described later. In addition, the numerical values "A to B" specified in the present specification indicate a range of values that satisfy the numerical value A and a value greater than the numerical value A and the numerical value B and a value smaller than the numerical value B. In addition, a "film" according to the present invention is not limited by thickness or the like and includes a "sheet" defined by JIS.

A resin composite according to the present invention contains 65 to 99 parts by mass, preferably 75 to 90 parts by mass, of a methacrylic resin (A), which will be described later, and 1 to 35 parts by mass, preferably 10 to 25 parts by mass, of a triblock copolymer (B) in 100 parts by mass of a resin mixture (M). When the content of the methacrylic resin (A) is less than 65 parts by mass, the surface hardness tends to decrease. When the content of the triblock copolymer (B) is less than 1 part by mass, the impact resistance tends to decrease.

The methacrylic resin (A) used in the present invention is a methacrylic resin that has 80% by mass of a structural unit derived from methyl methacrylate and that has a melt viscosity of 1500 to 3500 Pa·s at 220° C. and at a shear speed of 122/sec.

The proportion of the structural unit derived from methyl methacrylate in the methacrylic resin (A) needs to be no less than 80% by mass, is preferably no less than 90% by mass, or is more preferably no less than 95% by mass. In other words, the proportion of a structural unit derived from a monomer other than methyl methacrylate is no greater than 20% by mass, is preferably no greater than 10% by mass, or is more preferably no greater than 5% by mass, and a constitution in which all the monomers are methyl methacrylate is also included.

Examples of such monomers other than methyl methacrylate include methyl acrylate, ethyl acrylate, n-propyl acrylate, isopropyl acrylate, n-butyl acrylate, isobutyl acrylate, sec-butyl acrylate, tert-butyl acrylate, amyl acrylate, isoamyl acrylate, n-hexyl acrylate, 2-ethylhexyl acrylate, pentadecyl acrylate, and dodecyl acrylate; phenyl acrylate, benzyl acrylate, phenoxyethyl acrylate, 2-hydroxyethyl acrylate, 2-ethoxyethyl acrylate, glycidyl acrylate, and allyl acryl; acrylic acid esters such as cyclohexyl acrylate, norbornyl acrylate, and isobornyl acrylate; ethyl methacrylate, n-propyl methacrylate, isopropyl methacrylate, n-butyl methacrylate, isobutyl methacrylate, sec-butyl methacrylate, tert-butyl methacrylate, amyl methacrylate, isoamyl methacrylate, n-hexyl, methacrylate, 2-ethylhexyl methacrylate, pentadecyl methacrylate, and dodecyl methacrylate; phenyl methacrylate, benzyl methacrylate, phenoxyethyl methacrylate, 2-hydroxyethyl methacrylate, 2-ethoxyethyl methacrylate, glycidyl methacrylate, and allyl methacrylate; methacrylic acid esters other than methyl methacrylate, such as cyclohexyl methacrylate, norbornyl methacrylate, and isobornyl methacrylate; unsaturated carboxylic acids, such as acrylic acid, methacrylic acid, maleic anhydride, maleic acid, and itaconic acid; olefins, such as ethylene, propylene, 1-butene, isobutene, and 1-octene; conjugated dienes, such as butadiene, isoprene, and myrcene; aromatic vinyl compounds, such as styrene, α-methylstyrene, p-methylstyrene, and m-methylstyrene; acrylamide, methacrylamide, acrylonitrile, methacrylonitrile, vinyl acetate, vinylpyridine, vinylketone, vinyl chloride, vinylidene chloride, and vinylidene fluoride; and so on.

The tacticity of the methacrylic resin (A) is not particularly limited, and a methacrylic resin having a tacticity of being isotactic, heterotactic, or syndiotactic may be used, for example.

The melt viscosity of the methacrylic resin (A) at 220° C. and at a shear rate of 122/sec is in a range from 1500 to 3500 Pa·s. The melt viscosity is preferably no lower than 2000 Pa·s, is more preferably no lower than 2300 Pa·s, and is particularly preferably no lower than 2600 Pa·s. In addition, the melt viscosity is preferably no higher than 3300 Pa·s, is more preferably no higher than 3100 Pa·s, and is particularly preferably no higher than 3000 Pa·s. By setting the melt viscosity within a range from 1500 to 3500 Pa·s, the impact resistance and the toughness of a molded product or a film composed of the obtained resin composite can be retained favorably.

The methacrylic resin (A) is obtained through polymerization under a suitable condition in consideration of the degree of polymerization when one or more types of monomers that contain no less than 80% by mass of methyl methacrylate are polymerized.

A commercially available methacrylic resin may be used as the methacrylic resin (A) according to the present invention. Examples of such commercially available methacrylic resins include "PARAPET H1000B" (MFR: 22 g/10 min (230° C., 37.3 N)), "PARAPET GF" (MFR: 15 g/10 min (230° C., 37.3 N)), "PARAPET EH" (MFR: 1.3 g/10 min (230° C., 37.3 N)), "PARAPET HRL" (MFR: 2.0 g/10 min (230° C., 37.3 N)), "PARAPET HRS" (MFR: 2.4 g/10 min (230° C., 37.3 N)) and "PARAPET G" (MFR: 8.0 g/10 min (230° C., 37.3 N)) [these are all trade names, manufactured by Kuraray, Co., Ltd.).

The triblock copolymer (B) used in the present invention is a resin in which a methacrylic acid ester polymer block (b2) is coupled to each of two ends of an acrylic acid ester polymer block (b1). The triblock copolymer (B) to be used contains 30% to 60% by mass of the acrylic acid ester polymer block (b1) and 40% to 70% by mass of the methacrylic acid ester polymer block (b2), and the melt viscosity of the triblock copolymer (B) at 220° C. and at a shear rate of 122/sec is from 75 to 1500 Pa·s.

A primary constitutional unit of the acrylic acid ester polymer block (b1) is a structural unit derived from an acrylic acid ester. The proportion of the structural unit derived from an acrylic acid ester in the acrylic acid ester polymer block (b1) is preferably no lower than 50% by mass, is more preferably no lower than 70% by mass, is even more preferably no lower than 80% by mass, and is particularly preferably no lower than 90% by mass, and the constitution of 100% by mass is also included.

Examples of such acrylic acid esters include methyl acrylate, ethyl acrylate, n-propyl acrylate, isopropyl acrylate, n-butyl acrylate, isobutyl acrylate, sec-butyl acrylate, tert-butyl acrylate, amyl acrylate, isoamyl acrylate, n-hexyl acrylate, cyclohexyl acrylate, 2-ethylhexyl acrylate, pentadecyl acrylate, dodecyl acrylate, isobornyl acrylate, phenyl acrylate, benzyl acrylate, phenoxyethyl acrylate, 2-hydroxyethyl acrylate, 2-methoxyethyl acrylate, glycidyl acrylate, and allyl acrylate. The acrylic acid ester polymer block (b1) can be formed by polymerizing one type alone of the above acrylic acid esters or a combination of two or more types of the above acrylic acid esters. In particular, one obtained by polymerizing n-butyl acrylate alone is preferable from the viewpoint of the cost, the low-temperature characteristics, and so on.

The acrylic acid ester polymer block (b1) may include a structural unit derived from a monomer other than an acrylic acid ester unless such a structural unit hinders the object and the effect of the present invention. The proportion of the structural unit derived from a monomer other than an acrylic acid ester to be contained in the acrylic acid ester polymer block (b1) is preferably no higher than 50% by mass, is more preferably no higher than 30% by mass, is even more preferably no higher than 20% by mass, and is particularly preferably no higher than 10% by mass, and a case in which all the structural units are monomers derived from an acrylic acid ester is also included.

Examples of such monomers other than an acrylic acid ester include a methacrylic acid ester, an unsaturated carboxylic acid, an aromatic vinyl compound, olefin, conjugated diene, acrylonitrile, methacrylonitrile, acrylamide, methacrylamide, vinyl acetate, vinylpyridine, vinylketone, vinyl chloride, vinylidene chloride, and vinylidene fluoride. When a monomer other than an acrylic acid ester is used, the acrylic acid ester polymer block (b1) can be formed by copolymerizing one type alone thereof or two or more types thereof with the acrylic acid ester described above.

A primary constitutional unit of the methacrylic acid ester polymer block (b2) is a structural unit derived from a methacrylic acid ester. The proportion of the structural unit derived from a methacrylic acid ester in the methacrylic acid ester polymer block (b2) is preferably no lower than 80% by mass, is more preferably no lower than 90% by mass, is even more preferably no lower than 95% by mass, and is particularly preferably no lower than 98% by mass, and a case in which all the structural units are monomers derived from a methacrylic acid ester is also included. The two methacrylic acid ester polymer blocks (b2) coupled to the respective ends of the acrylic acid ester polymer block (b1) may independently be different from or identical to each other in terms of the type of the constituting monomer, the proportion of the structural unit derived from a methacrylic acid ester, the weight-average molecular weight, and the tacticity.

Examples of such methacrylic acid esters include methyl methacrylate, ethyl methacrylate, n-propyl methacrylate, isopropyl methacrylate, n-butyl methacrylate, isobutyl methacrylate, sec-butyl methacrylate, tert-butyl methacrylate, amyl methacrylate, isoamyl methacrylate, n-hexyl methacrylate, cyclohexyl methacrylate, 2-ethylhexyl methacrylate, pentadecyl methacrylate, dodecyl methacrylate, isobornyl methacrylate, phenyl methacrylate, benzyl methacrylate, phenoxyethyl methacrylate, 2-hydroxyethyl methacrylate, 2-methoxyethyl methacrylate, glycidyl methacrylate, and allyl methacrylate. Among the above, from the viewpoint of improving the transparency and the heat resisting properties, methacrylic acid alkyl esters such as methyl methacrylate, ethyl methacrylate, isopropyl methacrylate, n-butyl methacrylate, tert-butyl methacrylate, cyclohexyl methacrylate, and isobornyl methacrylate are preferable, and methyl methacrylate is more preferable. The methacrylic acid ester polymer block (b2) can be formed by polymerizing one type alone of the above methacrylic acid esters or a combination of two or more types of the above methacrylic acid esters.

The methacrylic acid ester polymer block (b2) may include a structural unit derived from a monomer other than a methacrylic acid ester unless such a structural unit hinders the object and the effect of the present invention. The proportion of the structural unit derived from a monomer other than a methacrylic acid ester to be contained in the methacrylic acid ester polymer block (b2) is preferably no higher than 20% by mass, is more preferably no higher than 10% by mass, is even more preferably no higher than 5% by mass, and is particularly preferably no higher than 2% by mass.

Examples of such monomers other than a methacrylic acid ester include an acrylic acid ester, an unsaturated carboxylic acid, an aromatic vinyl compound, olefin, conjugated diene, acrylonitrile, methacrylonitrile, acrylamide, methacrylamide, vinyl acetate, vinylpyridine, vinylketone, vinyl chloride, vinylidene chloride, and vinylidene fluoride. The methacrylic acid ester polymer block (b2) can be formed by copolymerizing one type alone of the above monomers other than a methacrylic acid ester or a combination of two or more types of the above monomers with the methacrylic acid ester described above.

The tacticity of the methacrylic acid ester polymer block (b2) is preferably such that the triad syndiotacticity (rr) is no lower than 60% from the viewpoint of increasing the heat resisting properties. By setting the syndiotacticity to no lower than 60%, the glass transition temperature is increased, and the resin composite according to the present invention exhibits superior heat resisting properties. The syndiotacticity is more preferably no lower than 65%, is even more preferably no lower than 70%, and is most preferably no lower than 75%.

The proportion of the methacrylic acid ester polymer block (b2) in the triblock copolymer (B) is preferably no lower than 40% by mass, is more preferably no lower than 43% by mass, and is even more preferably no lower than 47% by mass with respect to the total of 100% by mass of the acrylic acid ester polymer block (b1) and the methacrylic acid ester polymer block (b2) from the viewpoint of transparency, surface hardness, moldability, and surface smoothness. In addition, the stated proportion is preferably no higher than 70% by mass, is more preferably no higher than 65% by mass, and is even more preferably no higher than 60% by mass. In the triblock copolymer (B), the methacrylic acid ester polymer block (b2) is present at each end of the triblock copolymer (B). The proportion of the methacrylic acid ester polymer block (b2) described above is calculated on the basis of the total mass of the methacrylic acid ester polymer blocks (b2) at the two ends.

The melt viscosity of the triblock copolymer (B) at 220° C. and at a shear rate of 122/sec is in a range from 75 to 1500 Pa·s. The melt viscosity is more preferably no lower than 150 Pa·s and is particularly preferably no lower than 300 Pa·s. In addition, the melt viscosity is more preferably no higher than 1000 Pa·s and is particularly preferably no higher than 700 Pa·s. By setting the melt viscosity to a range from 75 to 1500 Pa·s, favorable melt-tension can be retained in melt-extrusion molding, and a favorable plate-shaped molded product can be obtained with ease. In addition, the dynamical physical properties, such as the rupture strength, of the obtained plate-shaped molded product can be retained favorably. Furthermore, an occurrence of fine grain finish-like unevenness or a protrusion associated with unmelted matter (polymeric matter) on the surface of the plate-shaped molded product obtained through melt-extrusion molding can be suppressed effectively, and a favorable film can be obtained.

In the triblock copolymer (B), the coupling between the acrylic acid ester polymer block (b1) and the methacrylic acid ester polymer blocks (b2) needs to be a triblock copolymer of (b2)-(b1)-(b2). When an acrylic acid polymer block is located at each end as in (b1)-(b2)-(b1), the adhesiveness at a high temperature increases, which leads to a problem in that the film tightly sticks to a roll during formation in film production or the like. In addition, when a diblock copolymer of (b1)-(b2) is used, the adhesiveness at a high temperature increases, which leads to a problem in that the film tightly sticks to a roll during formation in film production or the like, and the impact resistance of the film tends to decrease.

The two methacrylic acid ester polymer blocks (b2) to be coupled to the respective ends of the acrylic acid ester polymer block (b1) may have substantially the same mass percentage, but it is preferable that the mass percentages thereof in the triblock copolymer (B) differ from each other from the viewpoint of improving the flowability during melting. In other words, it is preferable that, when the content of the triblock copolymer (B) is 100% by mass, the methacrylic acid ester polymer blocks (b2) coupled to the respective ends of the acrylic acid ester polymer block (b1) have different mass percentages. By improving the flowability during melting, a film or a molded product that excels in surface smoothness and haze can be obtained.

When the mass percentages of the methacrylic acid ester polymer blocks (b2) differ from each other and when the block with a higher mass percentage is defined as (b2(H)) and the block with a lower mass percentage is defined as (b2(L)), it is preferable that the ratio of the mass percentage of (b2(H)) to the mass percentage of (b2(L)), (b2(H))/(b2(L)), in the triblock copolymer (B) be no lower than 1.3. It is more preferable that (b2(H))/(b2(L)) be no lower than 1.8, and the upper limit of (b2(H))/(b2(L)) is preferably no higher than 4 and is more preferably no higher than 3. As (b2(H))/(b2(L)) falls within this range, the flowability of the resin composite during melting can be improved, and thus a film or a molded product that excels in surface smoothness and haze can be obtained.

The triblock copolymer (B) may include a functional group, such as a hydroxyl group, a carboxyl group, an acid anhydride, or an amino group, in a molecular chain or at an end of the molecular chain, as necessary.

The method of producing the triblock copolymer (B) is not particularly limited, and a method based on well-known methods can be employed. For example, a method in which the monomer constituting each polymer block is subjected to living polymerization is typically used. Examples of techniques for such living polymerization include a method in which the monomer is subjected to anionic polymerization under the presence of a mineral acid salt, such as an alkali metal or an alkaline-earth metal salt, with an organic alkali metal compound being used as a polymerization initiator, a method in which the monomer is subjected to anionic polymerization under the presence of an organic aluminum compound with an organic alkali metal compound being used as a polymerization initiator, a method in which the monomer is polymerized with an organic rare-earth metal complex being used as a polymerization initiator, and a method in which the monomer is subjected to radical polymerization under the presence of a copper compound with an α-halogenated ester compound being used as an initiator. In addition, there is also a method in which the monomer constituting each block is polymerized with a polyvalent radical polymerization initiator or a polyvalent radical chain transfer agent being used and a mixture containing the triblock copolymer (B) used in the present invention is produced. Among the above methods, a method in which the monomer is subjected to anionic polymerization under the presence of an organic aluminum compound with an organic alkali metal compound being used as a polymerization initiator is particularly preferable since a high-purity triblock copolymer (B) can be obtained, since the molecular weight or the composition ratio can be controlled with ease, and since the method is economical.

In the resin composite according to the present invention, the ratio η(A)/η(B) of the melt viscosity η(A) to the melt viscosity η(B) is in the range from 1 to 20. The value of η(A)/η(B) is preferably no smaller than 3, is more preferably no smaller than 5, and is particularly preferably no smaller than 7. In addition, the value of η(A)/η(B) is preferably no greater than 15, is more preferably no greater than 12, and is particularly preferably no greater than 9. When the value of η(A)/η(B) is smaller than 1 or is greater than 20, the dispersiveness of the methacrylic resin (A) and the triblock copolymer (B) decreases, and the haze or the impact resistance tends to decrease.

It is preferable that the resin composite according to the present invention contain 0.3 to 3.0 parts by mass of a processing aid with respect to 100 parts by mass of the resin composite from the viewpoint of the compatibility with the resin composite and the film thickness accuracy when a resin film (R) composed of the resin composite is produced. When the content of the processing aid is less than 0.3 parts by mass, the film thickness accuracy of the edge portion of the resin film (R) decreases when the resin film (R) is thin. Thus, the yield of the film tends to decrease, and the film tends to break more easily. Meanwhile, when the content of the processing aid exceeds 3.0 parts by mass, the transparency of the resin film (R) tends to decrease.

It is preferable that the processing aid be composed of no less than 60% by mass of a methyl methacrylate unit and no greater than 40% by mass of a vinyl-based monomer unit that can be copolymerized with the methyl methacrylate unit, and it is more preferable that the processing aid be composed of 70% to 90% by mass of a methyl methacrylate unit and 10% to 30% by mass of a vinyl-based monomer unit that can be copolymerized with the methyl methacrylate unit, from the viewpoint of improving the compatibility with the resin composite. Examples of the vinyl-based monomers that can be copolymerized with methyl methacrylate include methacrylic acid esters, such as ethyl methacrylate, butyl methacrylate, and cyclohexyl methacrylate; acrylic acid esters, such as ethyl acrylate, methyl acrylate, butyl acrylate, and cyclohexyl acrylate; aromatic vinyl compounds, such as styrene, p-methylstyrene, and o-methylstyrene; maleimide-based compounds, such as N-propyl maleimide, N-cyclohexyl maleimide, and N-o-chlorophenyl maleimide; and polyfunctional monomers, such as ethylene glycol dimethacrylate, propylene glycol dimethacrylate, triethylene glycol dimethacrylate, hexanediol dimethacrylate, ethylene glycol diacrylate, propylene glycol diacrylate, triethylene glycol diacrylate, allyl methacrylate, and triallyl isocyanurate. In particular, butyl acrylate is preferable from the viewpoint of the compatibility with the resin composite according to the present invention. In addition, the mean degree of polymerization of such processing aids is preferably in the range from 3,000 to 40,000, is more preferably in the range from 15,000 to 30,000, and is particularly preferably in the range from 20,000 to 25,000 from the viewpoint of improving the compatibility with the resin composite.

The limiting viscosity of the processing aid is preferably from 3 to 6 dl/g. The effect of improving moldability is reduced when the limiting viscosity is smaller than 3, and the melt-flowability of the resin composite tends to decrease when the limiting viscosity is greater than 6.

The polymerization method for producing the processing aid is not particularly limited, but emulsion polymerization is suitable. Examples of emulsifying agents that can be used in emulsion polymerization include dialkyl sulfosuccinates, such as sodium dioctyl sulfosuccinate, which is an anionic emulsifying agent, and sodium dilauryl sulfosuccinate; alkyl benzenesulfonates, such as sodium dodecylbenzenesulfonate; alkyl sulfates, such as sodium dodecyl sulfate; polyoxyethylene alkyl ether sulfates, such as polyoxyethylene alkyl ether, which is a nonionic emulsifying agent, polyoxyethylene nonylphenyl ether sulfate, and sodium polyoxyethylene alkyl ether sulfate; and alkyl ether carboxylates, such as sodium polyoxyethylene tridecyl ether acetate.

In addition, depending on the type of the emulsifying agent to be used, an appropriate pH regulator can be used to prevent hydrolysis of methacrylic acid alkyl ester and acrylic acid alkyl ester when the pH of the polymerization system is on the alkali side. Examples of the pH regulators to be used include boric acid-potassium chloride-potassium hydroxide, potassium dihydrogen phosphate-sodium hydrogen phosphate, boric acid-potassium chloride-potassium carbonate, citric acid-potassium hydrogen citrate, potassium dihydrogen phosphate-boric acid, and sodium dihydrogen phosphate-citric acid.

In addition, the polymerization initiator may be a sole system of a water-soluble initiator or an oil-soluble initiator, or a redox system. A typical inorganic initiator, such as persulfate, can be used alone as an example of the water-soluble initiator, or the inorganic initiator can be combined with sulfite, bisulfite, thiosulfate, or the like and used as a redox system initiator.

Representative commercial products of such processing aids include the KANE ACE PA series manufactured by Kaneka Corporation, the METABLEN P series manufactured by Mitsubishi Rayon Co., Ltd., and the PARALOID K series manufactured by the Dow Chemical Company.

Various additives may be added as necessary to the resin composite used in the present invention within a range that does not hinder the effect of the present invention, and the examples of the additives include an antioxidant, a thermostabilizer, a lubricant, an antistatic agent, a colorant, and an impact resistance aid. It is preferable that a foaming agent, a filler, a delustering agent, a light diffusing agent, a softening agent, or a plasticizer be not added in a large amount from the viewpoint of the dynamical physical properties and the surface hardness of the film according to the present invention. When a colorant is added to the resin composite according to the present invention, the transparency, which the present invention addressed, may be not obtained. However, as long as the transparency is ensured in the resin composite in which a colorant component is not added, the standard for the "transparency" according to the invention of the present application is satisfied.

An ultraviolet absorber is a compound having a capability of absorbing ultraviolet radiation. An ultraviolet absorber is a compound said to have a function of converting primarily optical energy to heat energy.

Examples of the ultraviolet absorbers include benzophenones, benzotriazoles, triazines, benzoates, salicylates, cyanoacrylates, oxalic anilides, malonic esters, and formamidines. One type alone of the above may be used, or two or more types of the above may be used in combination. Among the above, benzotriazoles and hydroxyphenyl triazines are preferable, and hydroxyphenyl triazines are particularly preferable for their excellent effect of suppressing a deterioration of the resin when the resin is irradiated with ultraviolet radiation and for their high compatibility with the resin.

Examples of benzotriazoles include 2,2'-methylenebis[4-(1,1,3,3-tetramethylbutyl)6-(2H-benzotriazole-yl)phenol] (ADK STAB LA-31 manufactured by ADEKA Corporation, ADK STAB LA-31RG manufactured by ADEKA Corporation), 2-(2H-benzotriazol-2-yl)-4-(1,1,3,3-tetramethylbutyl) phenol (TINUVIN 329 manufactured by BASF), and 2-(2H-benzotriazol-2-yl)-4,6-bis(1-methyl-1-phenylethyl)phenol (TINUVIN 234 manufactured by BASF).

Examples of hydroxyphenyl triazines include 2,4-bis(2-hydroxy-4-butyroxyphenyl)-6-(2,4-butyloxyphenyl)-1,3,5-triazine (TINUVIN 460 manufactured by BASF), 2-(4-((2-hydroxy-3-(2-ethyl)hexyl)oxy)-2-hydroxyphenyl)-4,6-bis (2,4-dimethylphenyl)-1,3,5 triazine (TINUVIN 405 manufactured by BASF), 2-(2-hydroxy-4-(1-octyloxycarbonylethoxy)phenyl)-4,6-bis(4-phenyl)-1,3,5-triazine (TINUVIN 479 manufactured by BASF), and TINUVIN 1477 manufactured by BASF.

The resin composite used in the present invention can be mixed with another polymer other than the methacrylic resin (A) and the triblock copolymer (B) within a range that does not hinder the effect of the present invention. Examples of such other polymers include polyolefin resins, such as polyethylene, polypropylene, polybutene-1, poly-4-methyl-pentane-1, and polynorbornene; ethylene-based ionomers; styrene-based resins, such as polystyrene, a styrene-maleic anhydride copolymer, high impact polystyrene, an AS resin, an ABS resin, an AES resin, an AAS resin, an ACS resin, and an MBS resin; methyl methacrylate-styrene copolymers; polyester resins, such as polyethylene terephthalate and polybutylene terephthalate; polyamides, such as nylon 6, nylon 66, and polyamide elastomer; polycarbonate, polyvinyl chloride, polyvinylidene chloride, polyvinyl alcohol, ethylene-vinyl alcohol copolymer, polyacetal, polyvinylidene fluoride, polyurethane, modified polyphenylene ether, polyphenylene sulfide, and a silicone modified resin; acrylic rubber and silicone rubber; styrene-based thermoplastic elastomers, such as SEPS, SEBS, and SIS; and olefin-base rubber, such as IR, EPR, and EPDM.

The method of preparing the resin composite used in the present invention is not particularly limited, but a melt-compounding method, for example, is recommended in order to increase the dispersiveness of each component constituting the resin composite. In the method of melt-compounding the methacrylic resin (A) and the triblock copolymer (B), they may be mixed with an additive as necessary, or the methacrylic resin (A) may be mixed with an additive and the triblock copolymer (B) may then be mixed thereinto. The compounding operation can be carried out with the use of a known mixing or compounding device, such as a kneader-ruder, an extruder, a mixing roll, or a Bunbury mixer, for example. In particular, it is preferable to use a twin screw extruder from the viewpoint of improving the compoundability and the compatibility of the methacrylic resin (A) and the triblock copolymer (B). It is preferable that the shear rate at the time of melt-compounding be from 10/sec to 1000/sec. The temperature at the time of mixing/compounding may be adjusted as appropriate in accordance with the melting temperature or the like of the methacrylic resin (A), the triblock copolymer (B), and so on to be used, is preferably in the range from 110° C. to 300° C., and is more preferably in the range from 180° C. to 300° C.

When the melt-compounding is carried out with the use of a twin screw extruder, it is preferable to use a vent and to carry out the melt-compounding under a reduced pressure or under a nitrogen stream from the viewpoint of suppressing coloring. In this manner, the resin composite according to the present invention can be obtained in a desired form, such as a pellet or powder. The resin composite in the form of a pellet, powder, or the like is suitable for use as a molding material.

In addition, it is also possible to prepare the resin composite used in the present invention that includes the triblock copolymer (B) by dissolving the triblock copolymer (B) in a mixed solution of an acryl-based monomer, which is a monomer unit of the methacrylic resin (A), and a solvent such as toluene and by polymerizing the acryl-based monomer.

<Molded Product>

A molded product according to the present invention is a molded product that includes a molding formed of the resin composite according to the present invention. A melt-extrusion molding method, such as a T-die method, a calendar method, or an inflation method, and an injection molding method or the like can be applied to produce the molding according to the present invention. The molded product according to the present invention may be a molding consisting only of the resin composite according to the present invention or may be a molded product in which a molding composed of the resin composite according to the present invention and a molded product composed of another resin composite are integrated through, for example, bonding or the like.

<Film>

A film according to the present invention includes at least a resin film (R) formed of the resin composite according to the present invention. In other words, the film according to the present invention may be a film consisting only of the resin film (R) or may be a film in which another layer is laminated.

The resin film (R) formed of the resin composite according to the present invention can be produced through a well-known method, such as a T-die method, an inflation method, a melt-casting method, and a calendar method. From the viewpoint of obtaining a resin film (R) having high surface smoothness and low haze, a method that includes a step of extruding the melt-compounded product from a T-die in a melted state and shaping by bringing both surfaces of the melt-compounded product into contact with a surface of a mirror finish roll or a surface of a mirror finish belt is preferable. The roll or the belt to be used in this case is preferably made of metal. In a case in which both surfaces of the extruded melt-compounded product are brought into contact with a mirror finish surface in this manner for production, it is preferable that the resin film (R) be pressured and pinched by the mirror finish roll or the mirror finish belt. The lower limit, as a linear pressure, of the pinching pressure of the mirror finish roll or the mirror finish belt is preferably no lower than 3 N/mm, is more preferably no lower than 5 N/mm, and is particularly preferably no lower than 7 N/mm. In addition, the upper limit is preferably no higher than 50 N/mm, is more preferably no higher than 30 N/mm, and is particularly preferably no higher than 15 N/mm. The surface smoothness tends to decrease when the linear pressure is lower than 3 N/mm, and the film tends to be distorted when the linear pressure is higher than 50 N/mm, which is not preferable.

In the case of the production method using the T-die method, an extruder-type melt-extruding device or the like provided with single or twin extruding screws can be used. The melt-extrusion temperature for producing the resin film (R) is preferably no lower than 200° C. and is more preferably no lower than 220° C. In addition, the temperature is preferably no higher than 300° C. and is more preferably no higher than 270° C. When a melt-extruding device is used and the melt-extrusion is carried out, it is preferable to use a vent and to carry out the melt-extrusion under a reduced pressure or under a nitrogen stream from the viewpoint of suppressing coloring.

In addition, from the viewpoint of obtaining a resin film (R) having high surface smoothness, high surface glossiness, and low haze, the surface temperature of the mirror finish roll or the mirror finish belt that pinches the resin film (R) is preferably no lower than 60° C. and is more preferably no lower than 70° C. In addition, the temperature is preferably no higher than 130° C. and is more preferably no higher than 100° C. The surface smoothness and the haze of the obtained resin film (R) tend to be insufficient when the surface temperature of the mirror finish roll or the mirror finish belt that pinches the resin film (R) is lower than 60° C. The resin film (R) makes too tight contact with the mirror finish roll or the mirror finish belt when the surface temperature exceeds 130° C., and thus the surface of the resin film (R) is roughened easily when the film is peeled off from the mirror finish roll or the mirror finish belt, which causes transverse wrinkles or the like and tends to degrade the appearance of the resin film (R).

The roughness of at least one surface of the resin film (R) is preferably no greater than 2.5 nm and is more preferably no greater than 1.5 nm. Thus, the film excels in surface smoothness and in handling when being cut or stamped, and the film excels in surface glossiness when used for an application that requires a sophisticated design. When printing is performed on the film according to the present invention, the film excels in sharpness in a pattern layer or the like. In addition, in the optical applications, the film excels in such optical characteristics as the light ray transmittance and in the shaping accuracy when surface shaping is carried out.

In addition, the haze of the resin film (R) is preferably no greater than 0.7%, is more preferably no greater than 0.3%, and is even more preferably no greater than 0.2%. Thus, when the resin film (R) is used for an application that requires a sophisticated design, the resin film (R) provides superior surface glossiness and superior sharpness in the pattern layer printed on the film according to the present invention. In addition, in such optical applications as a liquid crystal protection film or a light guide film, the utilization efficiency of the light source increases, which is thus preferable. Furthermore, the film excels in the shaping accuracy when surface shaping is carried out, which is thus preferable.

In addition, it is preferable that the temperature dependence of haze of the resin film (R) be smaller. Thus, when the resin film (R) is used for applications that require transparency in a broad temperature range or is used at a high temperature, the transparency is not lost, leading to superiority.

In addition, the impact resistance of the resin film (R) is preferably no less than 40 mJ and is more preferably no less than 50 mJ. Thus, a film that is less susceptible to breaking is obtained, and the productivity of the film improves, which is thus preferable.

The thickness of the resin film (R) is preferably no more than 500 µm. When the thickness exceeds 500 µm, the laminatability and handling at the time of cutting, stamping, or the like decreases, making it difficult to use the resin film (R), and the cost per unit area increases, leading to an economic disadvantage, which is thus not preferable. The thickness of the resin film (R) is more preferably no less than 40 µm and is even more preferably no less than 50 µm. In addition, the thickness is more preferably no more than 300 µm and is even more preferably no more than 200 µm.

The resin film (R) may have been subjected to an orientation process. The mechanical strength increases through the orientation process, and the resin film (R) that is less susceptible to cracking can be obtained. The orientation method is not particularly limited, and a simultaneous biaxial orientation method, a sequential biaxial orientation method, a tubular orientation method, a rolling method, or the like can be used. With regard to the temperature at the time of orientation, from the viewpoint of achieving uniform orientation and obtaining the resin film (R) with high strength, the lower limit is the temperature that is higher than the glass transition temperature of the methacrylic resin by 5° C., and the upper limit is the temperature that is higher than the glass transition temperature of the methacrylic resin by 40° C. When the orientation temperature is too low, the molded product tends to break more easily during orientation. When the orientation temperature is too high, the effect of the orientation process is not exhibited sufficiently, and the strength of the molded product is less likely to increase. The orientation is typically carried out at 100%/min to 5000%/min. When the orientation rate is low, the strength is less likely to increase, and the productivity decreases. Meanwhile, when the orientation rate is high, the molded product may break, which makes uniform orientation difficult. After the orientation, it is preferable to carry out heat sealing. Through the heat sealing, a film with less heat contraction can be obtained. The thickness of the film obtained through the orientation is preferably from 10 to 200 µm.

The resin film (R) may be colored. The coloring method can be a method in which the composite of the methacrylic resin (A) and the triblock copolymer (B) itself is made to contain a pigment or a dye, and the resin that has not been made into a film is colored; a dyeing method in which the resin film (R) is immersed in a liquid in which a dye is dispersed and is colored; and so on, but the coloring method is not particularly limited to the above.

The resin film (R) may have printing performed on at least one surface thereof. Designs such as patterns, characters, and graphics and colors are provided through printing. The designs may be chromatic or achromatic. It is preferable that the printing be performed on a side that is in contact with another thermoplastic resin or thermosetting resin, which will be described later, in order to prevent fading of the printed layer.

The hardness of at least one surface of the resin film (R) is preferably HB or higher and is more preferably F or higher in terms of the pencil hardness measured in accordance with JIS-K5600-5-4. The resin film (R) having a surface that is at HB or harder is less likely to be scratched and is thus suitably used as a decorative and protective film on the surface of a molded product that requires a sophisticated design.

The film according to the present invention may be a film in which at least one of (i) a layer made of metal and/or metal oxide, (ii) a thermoplastic resin layer, and (iii) a base material layer is laminated on at least one surface of the resin film (R). The method of laminating another layer is not particularly limited, and the other layer may be laminated directly or with a bonding layer interposed therebetween. Examples of the base material layer include a wooden base material and non-wooden fiber such as kenaf. One or a plurality of such layers can be laminated.

The other layer mentioned above may be laminated on at least one surface of the resin film (R) in the film according to the present invention. The thickness of the film according to the present invention can vary depending on the applications and is thus not limited, but the thickness is preferably no greater than 500 μm from the viewpoint of secondary processability.

Examples of the thermoplastic resins suitable for lamination include a polycarbonate resin, a polyethylene terephthalate resin, a polyamide resin, a polyethylene resin, a polypropylene resin, a polystyrene resin, a polyvinyl chloride resin, other (meth)acrylic resins, ABS (acrylonitrile-butadiene-styrene copolymer), an ethylene vinyl alcohol resin, a polyvinyl butyral resin, a polyvinyl acetal resin, a styrene-based thermoplastic elastomer, an olefin-based thermoplastic elastomer, and an acryl-based thermoplastic elastomer.

The method of producing the laminated film is not particularly limited. For example, (1) a method in which the resin film (R) and another thermoplastic resin film are prepared separately and are laminated continuously between heat rolls, a method in which the resin film (R) and the other thermoplastic resin film are subjected to thermocompression bonding by a press, a method in which the resin film (R) and the other thermoplastic resin film are subjected to air-pressure forming or vacuum forming and are laminated at the same time, a method in which the resin film (R) and the other thermoplastic resin film are laminated together with a bonding layer interposed therebetween (wet lamination); (2) a method in which another thermoplastic resin that has been melt-extruded from a T-die is laminated on the resin film (R); (3) a method in which a film in which the resin film (R) and a layer of another thermoplastic resin film are laminated together is obtained by co-extruding the resin composite that includes the above-described methacrylic resin (A) and the above-described triblock copolymer (B) and the other thermoplastic resin; and so on can be used.

Among the above methods, in the methods of (1) or (2), a bonding surface of the resin film (R) or the other thermoplastic resin film may be subjected to surface treatment such as corona treatment before being laminated.

In addition, when a layer made of metal and/or metal oxide is to be provided in the film according to the present invention, examples of the metal that can be used include aluminum, silicon, magnesium, palladium, zinc, tin, nickel, silver, copper, gold, indium, stainless steel, chromium, and titanium, and examples of the metal oxide that can be used include aluminum oxide, zinc oxide, antimony oxide, indium oxide, calcium oxide, cadmium oxide, silver oxide, gold oxide, chromium oxide, silicon oxide, cobalt oxide, zirconium oxide, tin oxide, titanium oxide, iron oxide, copper oxide, nickel oxide, platinum oxide, palladium oxide, bismuth oxide, magnesium oxide, manganese oxide, molybdenum oxide, vanadium oxide, and barium oxide. These metals and metal oxides may each be used alone or may be used as a mixture of two or more types thereof. Among the above, indium is preferable because it excels in design sophistication and is less susceptible to losing glossiness even when a metal layer is provided on the resin film (R) through vapor deposition or the like and a film on which another layer is laminated is subjected to deep-draw forming. In addition, aluminum is particularly preferable when in particular a deep draw is not required because aluminum excels in design sophistication and is industrially available inexpensively. With regard to the method of providing a layer of such metal and/or metal oxide, a vacuum vapor deposition method is typically used, but other methods such as ion plating, sputtering, and CVD (Chemical Vapor Deposition) may also be used. The thickness of the deposited film made of metal and/or metal oxide is typically approximately from 5 to 100 nm. The thickness is preferably from 5 to 250 nm in a case in which deep-draw forming is carried out after the layer is formed.

In the film according to the present invention, the resin film (R) may be used alone, may be used as an inner layer or a part thereof, or may be used as an outermost layer. The number of films to be laminated is not particularly limited. Another resin to be used in lamination is preferably a transparent resin such as a methacrylic resin from the viewpoint of design sophistication of the film. From the viewpoint that the film is less prone to damage and the sophisticated design lasts longer, the outermost layer preferably has high surface hardness and high weatherability, and a film made of a methacrylic resin or a resin film (R), for example, is preferable.

(Article)

An article according to the present invention is an article in which the film according to the present invention is provided on a surface of the article made of another thermoplastic resin, a thermosetting resin, a wooden base material, or a non-wooden fiber base material, or the like.

Examples of the other thermoplastic resin to be used for the article include a polycarbonate resin, a polyethylene terephthalate resin, a polyamide resin, a polyethylene resin, a polypropylene resin, a polystyrene resin, a polyvinyl chloride resin, other (meth)acrylic resins, an ABS (acrylonitrile-butadiene-styrene copolymer) resin, an ethylene vinyl alcohol resin, a polyvinyl butyral resin, a polyvinyl acetal resin, a styrene-based thermoplastic elastomer, an olefin-based thermoplastic elastomer, and an acryl-based thermoplastic elastomer. Examples of the other thermosetting resin include an epoxy resin, a phenolic resin, and a melamine resin. In addition, the article according to the present invention may be an article in which the film according to the present invention or a laminated film according to the present invention is provided on a surface of a wooden base material or a base material made of non-wooden fiber such as kenaf.

The method of producing the article according to the present invention is not particularly limited. For example, the film or the laminated film according to the present invention can be vacuum formed, air-pressure formed, or compression formed while being heated on the surface of another thermoplastic resin, a thermosetting resin, a wooden base material, or a non-wooden fiber base material, and thus the article according to the present invention can be obtained. In the article according to the present invention, a film having the resin film (R) formed of the resin composite according to the present invention is provided on an outermost layer of a molded product or a base material, and thus the article excels in surface smoothness, surface hardness, surface glossiness, and so on. In addition, when printing is performed on the film according to the present invention, the patterns and the like are displayed sharply. In addition, in the film according to the present invention in which a metal layer is laminated, specular glossiness comparable to that of a metal can be obtained.

A preferable method of producing the article according to the present invention is a method typically referred to as an injection molding simultaneous lamination method.

This injection molding simultaneous lamination method is a method in which the film according to the present invention is inserted between matching male and female molds for injection molding, a melted thermoplastic resin is injected into the molds from one surface of the film, an injection-molded product is formed, and simultaneously the film is laminated onto the molded product.

The film to be inserted into the molds may be flat or may be shaped into a corrugated shape through preforming, such as vacuum forming or air-pressure forming.

The preforming of the film may be carried out with a separate molding machine, or the preforming may be carried out with the molds of the injection molding machine used in the injection molding simultaneous lamination method. The method of the latter, that is, the method in which a film is preformed and a melted resin is injected onto one side of the film is referred to as insertion molding.

When the film according to the present invention is used, it is preferable that the film be disposed such that the other laminated thermoplastic resin layer is on the resin side that is to be injection-molded, that is, the film according to the present invention serves as the outermost surface. In this manner, an article on the outermost surface of which the film according to the present invention is provided can be obtained.

The resin composite according to the present invention excels in transparency, surface hardness, surface smoothness, and so on, experiences less whitening when being heated, and excels in impact resistance. Therefore, a molded product and a film formed by using the resin composite according to the present invention excel in transparency, surface hardness, surface smoothness, and so on, experience less whitening when being heated, and excel in impact resistance. Accordingly, the present invention can be suitably used for a product that requires a sophisticated design or for optical applications while utilizing these excellent properties.

EXAMPLES

Hereinafter, the present invention will be described more specifically by illustrating examples and comparative examples. It is to be noted that the present invention is not limited by the following examples. In addition, the present invention encompasses all the aspects formed by combining, as desired, the matters expressing the technical features such as characteristic values, modes, production methods, and applications described thus far. The values of the physical properties in the examples and the comparative examples were measured through the following methods.

[Proportion of Each Constitutional Unit]

The proportion of each constitutional unit of the methacrylic resin and the triblock copolymer was calculated from the charged amount of each monomer.

[Melt Viscosity]

The melt viscosity of each of the methacrylic resin (A) and the triblock copolymer (B) at 220° C. and at a shear rate of 122/sec was measured under the following condition. The methacrylic resin (A) or the triblock copolymer (B) was extruded from a capillary of Capirograph (type 1D, manufactured by Toyo Seiki Seisaku-Sho, Ltd.) having a diameter of 1 mm and a length of 10 mm at 220° C. at a piston speed of 10 mm/min, and the numerical value evaluated from the shear stress generated under the above condition was taken as the melt viscosity.

[Production of Film]

With the use of a vent-type single screw extruder having a diameter of 65 mm, the resin composite was extruded from a die having a width of 900 mm at an extrusion temperature of 250° C. and at an extrusion rate of 40 kg/h, pinched between a metal elastic roll having a surface temperature of 80° C. and a metal rigid roll having a surface temperature of 80° C. at a linear pressure of 9 N/mm, and drawn at 10 m/min. Thus, a film having a thickness of 75 μm was produced.

[Haze of Film]

The film produced through the production conditions described above was cut out to form a test piece of 50 mm by 50 mm, and the haze of the test piece was measured at 23° C. in accordance with JIS K 7136.

[Pencil Hardness of Film]

The film produced through the production conditions described above was cut out to form a test piece of 10 cm by 10 cm, and the pencil hardness of the test piece was measured in accordance with JIS K 5600-5-4.

[Surface Roughness (Measurement of Surface Smoothness of Film)]

The film produced through the production conditions described above was cut out to form a test piece of 5 mm by 5 mm. The shape of the surface was measured with the use of an atomic force microscope (SPI 4000 Probe Station E-sweep environmental control unit, manufactured by SII nanotechnology Inc.) in the DFM mode. SI-DF20 (back side A1) from SII nanotechnology Inc. was used for a probe. Prior to the measurement of the sample, the surface roughness of a reference sample with a pitch of 10 μm and a step height of 100 nm was measured to confirm that the instrument had measurement errors in the X-axis and the Y-axis of no more than 5% with respect to 10 μm and a measurement error in the Z-axis of no more than 5% with respect to 100 nm.

The observation region of the sample was 5 μm by 5 μm, and the measurement frequency was 0.5 Hz. The number of scanning lines was 512 along the X-axis and 512 along the Y-axis. The measurement was carried out in the atmospheric environment at a temperature of 25±2° C. and a humidity of 30±5%. The obtained measurement data was analyzed by data processing software that accompanied the apparatus, and the mean surface roughness Ra was determined. Specifically, the [Tertiary inclination correction] command under the [Tool] menu of the measurement software for the apparatus was selected to correct the inclination of the film and the inclination of the whole surface arising due to large waves, and then the [Surface roughness analysis] command under the [Analysis] menu was selected to obtain the mean surface roughness Ra. The mean surface roughness Ra is a value obtained by averaging the absolute values of the deviations from the reference surface to the specified surface and is defined by the following formula.

$$Ra = \frac{1}{S_0} \int_X \int_Y |F(X, Y) - Z_0| dX dY \quad [\text{Math. 1}]$$

In the above, F(X,Y) represents the value of the height on the (X,Y) coordinates. $Z_0$ represents the mean value of the Z data defined as follows.

$$Z_0 = \frac{1}{S_0} \int_X \int_Y F(X, Y) dX dY \quad [\text{Math. 2}]$$

In addition, $S_0$ represents the area of the measurement region.

The mean surface roughness Ra was measured at ten different regions on both sides (referred to as the A side and the B side, for convenience) of the film, and the mean value of the mean surface roughness Ra at ten regions was taken as the surface roughness of the film.

The tertiary inclination correction was carried out by fitting the measured sample surface to a tertiary approximate surface estimated by the least-square method in order to eliminate the influence of the inclination and the waves of the film sample.

[Temperature Whitening (Temperature Dependence of Haze)]

The film produced through the production conditions described above was cut out to form a test piece of 50 mm by 50 mm, the haze (prior to heating) thereof was measured in accordance with JIS K 7136, and the test piece was then left in an oven at a temperature of 80° C. for ten minutes. The test piece was taken out of the oven, and immediately the haze (after heating) of the test piece was measured with a haze meter (haze meter HM-150 manufactured by Murakami Color Research Laboratory) in accordance with JIS K 7136 and determined by the following evaluation criteria. It is to be noted that the change in the haze as used herein is expressed by the following formula.

change in haze=haze (after heating)−haze (prior to heating)

E (Excellent): The change in the haze is no greater than 0.1%.

G (Good): The change in the haze is greater than 0.1% but no greater than 0.5%.

P (Poor): The change in the haze is greater than 0.5%.

[Specular Glossiness of Laminated Film]

The resin film (R) produced through the production conditions described above was cut out into a piece of 20 cm by 30 cm, one surface of the piece was subjected to corona discharge treatment, and then aluminum was deposited through the vapor deposition method to obtain a laminated film. The thickness of the aluminum layer was 30 nm. The appearance of the specular glossiness of the non-vapor-deposited surface of this laminated film was visually evaluated.

E (Excellent): With specular gloss.

G (Good): With some specular gloss.

P (Poor): With no specular gloss.

[Impact Resistance]

The film was affixed to a steel mounting plate with an air gap, and an iron ball with a weight of 20 g was allowed to free fall onto the film in the air gap portion. The height from which the iron ball was allowed to free fall was changed by 10 cm, and the impact strength was evaluated by the maximum height from which the iron ball could be dropped without breaking the film.

[Film Thickness Accuracy]

With regard to the resin film (R) produced through the production conditions described above, the thickness at a position that is 50 mm from an edge portion was measured at 20 points at every 10 mm along the flow direction with the use of a micrometer (MPC-25MXT manufactured by Mitutoyo Corporation). The difference between the maximum value and the minimum value of the measured thicknesses was calculated and evaluated by the following criteria.

E (Excellent): The difference in the thickness is less than 2 μm.

G (Good): The difference in the thickness is no less than 2 μm and less than 4 μm.

P1 (Possible): The difference in the thickness is no less than 4 μm and less than 5 μm.

P2 (Poor): The difference in the thickness is no less than 5 μm.

[Method of Producing Article]

An ABS resin was affixed to the laminated film obtained through the condition of Example 1 described below with the use of a vacuum air-pressure forming machine at a heating temperature of 160° C. to obtain an article.

In the reference examples illustrated hereinafter, the used compounds were those dried and purified according to a conventional method and degassed with nitrogen. In addition, the transfer and the supply of the compound were carried out under a nitrogen atmosphere.

Reference Example 1

[Synthesis of Methacrylic Resin (A-1)]

0.1 parts by mass of a polymerization initiator (2,2'-azobis(2-methylpropionitrile), hydrogen withdrawing ability: 1%, 1 hour half-life temperature: 83° C.) and 0.21 parts by mass of a chain transfer agent (n-octylmercaptan) were added to and dissolved in a monomer consisting of 100 parts by mass of methyl methacrylate to obtain a raw material liquid.

100 parts by mass of ion exchanged water, 0.03 parts by mass of sodium sulfate, and 0.45 parts by mass of a suspension dispersant were mixed together to obtain a mixed solution. 420 parts by mass of the mixed solution and 210 parts by mass of the raw material liquid were charged in a pressure resistant polymerization tank, and a polymerization reaction was started while stirring under a nitrogen atmosphere at a temperature of 70° C. When three hours has passed from the start of the polymerization reaction, the temperature was raised to 90° C. and stirring was continued for one more hour to obtain a liquid in which the bead-like copolymer was dispersed. Although polymer slightly adhered to the wall surface of the polymerization tank or to the stirring blades, the polymerization reaction proceeded smoothly without foaming.

The obtained copolymer dispersion was washed with an appropriate amount of ion exchanged water, the bead-like copolymer was taken out by a bucket-type centrifugal separator and dried for 12 hours with a hot air drier at 80° C. to obtain a bead-like methacrylic resin (A) (hereinafter, referred to as the "methacrylic resin (A-1)").

The obtained methacrylic resin (A-1) had a methyl methacrylate content of 100% by mass and a melt viscosity of 3000 Pa·s at 220° C. and at a shear rate of 122/sec.

Reference Example 2

[Synthesis of Methacrylic Resin (A-2)]

A methacrylic resin (A-2) was polymerized and produced in a similar manner to that of Reference Example 1 except in that the used monomer was changed to one having 99.3 parts by mass of methyl methacrylate and 0.7 parts by mass of methyl acrylate and the amount of the chain transfer agent was changed to 0.24 parts by mass. The obtained methacrylic resin (A-2) had a methyl methacrylate content of 99.3% by mass and a melt viscosity of 2780 Pa·s at 220° C. and at a shear rate of 122/sec.

Reference Example 3

[Synthesis of Triblock Copolymer (B-1)]

Under a catalyst of hexamethyltriethylenetetramine and isobutylbis(2,6-di-tert-butyl-4-methylphenoxy)aluminum in toluene solution, polymerization was performed with sec-butyllithium being used as a polymerization initiator. 15 parts by mass of methyl methacrylate was added dropwise to polymerize a methacrylic acid ester polymer block (b2-1), and then 50 parts by mass of n-butyl acrylate was added dropwise to polymerize an acrylic acid ester polymer block (b1). Furthermore, 35 parts by mass of methyl methacrylate was added dropwise to polymerize a methacrylic acid ester polymer block (b2-2), and lastly the polymerization was stopped with methanol to obtain a triblock copolymer (B-1). The obtained triblock copolymer had a triblock structure of (b2-1)-(b1)-(b2-2), and the composition ratio of (b2-1)-(b1)-(b2-2) was 15% by mass-50% by mass-35% by mass. In addition, the melt viscosity of the triblock copolymer (B-1) at 220° C. and at a shear rate of 122/sec was 377 Pa·s. With regard to the block (b2-1) and the block (b2-2), when the mass percentage of the triblock copolymer (B) is 100, the block (b2-2) had a higher mass percentage than the block (b2-1), and the ratio of the mass percentage of (b2-2) to the mass percentage of (b2-1), that is, (b2(H))/(b2(L)) was 2.3.

Reference Example 4

[Synthesis of Triblock Copolymer (B-2)]

Under the same solvent and catalyst conditions as in Reference Example 3, the molecular weight was adjusted by adjusting the polymerization initiator, the amount of the polymerizable monomer was adjusted, and a triblock copolymer (B-2) having a structure of (b2-1) composed of methyl methacrylate-(b1) composed of butyl acrylate-(b2-2) composed of methyl methacrylate was obtained. The composition ratio of (b2-1)-(b1)-(b2-2) was 15% by mass-70% by mass-15% by mass. The melt viscosity of the obtained triblock copolymer (B-2) at 220° C. and at a shear rate of 122/sec was 650 Pa·s. The ratio of the mass percentage of (b2-1) to the mass percentage of (b2-2), (b2-1)/(b2-2), was 1.

Reference Example 5

[Synthesis of Diblock Copolymer (B-3)]

Under the same solvent and catalyst conditions as in Reference Example 3, the molecular weight was adjusted by adjusting the polymerization initiator, the amount of the polymerizable monomer was adjusted, and a diblock copolymer (B-3) having a structure of (b2) composed of methyl methacrylate-(b1) composed of n-butyl acrylate/benzyl acrylate=50/50 (mass percentage) was obtained. The composition ratio of (b2)-(b1) was 50% by mass-50% by mass. The melt viscosity of the obtained diblock copolymer (B-3) at 220° C. and at a shear rate of 122/sec was 407 Pa·s.

Example 1

85 parts by mass of the methacrylic resin (A-1), 15 parts by mass of the triblock copolymer (B-1), 1.5 parts by mass of a processing aid A (PARALOID K-125 manufactured by the Dow Chemical Company; a copolymer composed of 79% by mass of methyl methacrylate and 21% by mass of a butyl acrylate unit and having a mean degree of polymerization of 20,000), and 1 part by mass of an ultraviolet absorber B (TINUVIN 479 manufactured by BASF) were melt-compounded by a twin screw extruder at 250° C. and at 82/sec, extruded in a strand shape, and cut by a pelletizer to produce a pellet of a resin composite.

The obtained resin composite was melt in a vent-type single screw extruder having a diameter of 65 mm, extruded from a die having a width of 900 mm at an extrusion temperature of 250° C. and an extrusion rate of 40 kg/h, pinched between a metal elastic roll having a surface temperature of 80° C. and a metal rigid roll having a surface temperature of 80° C. at a linear pressure of 9 N/mm, and drawn at 10 m/min. Thus, the resin film (R) having a thickness of 75 μm was produced. The haze, the pencil hardness, the surface roughness, the stress whitening, and the temperature whitening (80° C.) of the obtained resin film (R) were measured. In addition, one side of this resin film (R) was subjected to corona discharge treatment, and then aluminum was deposited through the vacuum vapor deposition method. The thickness of the aluminum layer was 30 nm. The specular glossiness of the film obtained in this manner was evaluated. The result is shown in Table 1.

Examples 2 and 3

Except that the formulation illustrated in Table 1 was employed, a film was obtained in the same method as in Example 1, and the physical properties were evaluated in the same method. The processing aid B and the ultraviolet absorber A illustrated in Table 1 are the processing aid B (METABLEN P530A manufactured by Mitsubishi Rayon Co., Ltd.; a copolymer composed of 80% by mass of methyl methacrylate and 20% by mass of a butyl acrylate unit and having a mean degree of polymerization of 24,000) and the ultraviolet absorber A (LA-31RG manufactured by ADEKA Corporation). The result is shown in Table 1.

Comparative Examples 1 to 3

Except that the formulation illustrated in Table 1 was employed, a film was obtained in the same method as in Example 1, and the physical properties were evaluated in the same method. The result is shown in Table 1.

TABLE 1

|  | Example 1 | Example 2 | Example 3 | Comparative Example 1 | Comparative Example 2 | Comparative Example 3 |
|---|---|---|---|---|---|---|
| resin composite |  |  |  |  |  |  |
| methacrylic resin (A) [parts by mass] |  |  |  |  |  |  |
| methacrylic resin (A-1) MA = 0% (η: 3000 Pa·s) | 85 |  |  |  |  |  |
| methacrylic resin (A-2) MA = 0.7% (η: 2780 Pa·s) |  | 80 | 85 | 80 | 80 | 60 |
| block copolymer (B) [parts by mass] |  |  |  |  |  |  |
| block copolymer (B-1) triblock (η: 377 Pa·s) | 15 | 20 | 15 |  |  | 40 |
| block copolymer (B-2) triblock (η: 650 Pa·s) |  |  |  | 20 |  |  |
| block copolymer (B-3) diblock (η: 407 Pa·s) |  |  |  |  | 20 |  |
| ηA/ηB (220° C., shear rate 122s-1) | 8 | 7.4 | 7.4 | 4.3 | 6.8 | 7.4 |

TABLE 1-continued

|  | Example 1 | Example 2 | Example 3 | Comparative Example 1 | Comparative Example 2 | Comparative Example 3 |
|---|---|---|---|---|---|---|
| processing aid | | | | | | |
| processing aid A (PARALOID K125) | 1.5 | | | | | 1.5 |
| processing aid B (METABLEN P530A) | | 1.5 | | 1.5 | 1 | |
| ultraviolet absorber | | | | | | |
| ultraviolet absorber A (ADK STAB LA-31RG) | | 2.0 | | 2.0 | 2.0 | |
| ultraviolet absorber B (TINUVIN 479) | 1.0 | | 1.0 | | | 1.0 |
| properties of film | | | | | | |
| haze [%] | 0.2 | 0.2 | 0.2 | 9.4 | 0.1 | 0.3 |
| pencil hardness | HB | HB | HB | HB | F | <6B |
| surface roughness [nm] | 1.3 | 1.6 | 1.3 | 0.8 | 1.1 | 1.8 |
| temperature whitening (temperature dependence of haze) | E | E | E | E | E | E |
| specular glossiness of laminated film | E | E | E | E | E | E |
| impact resistance [mJ] | 50 | 60 | 50 | 70 | 10 | 70 |
| film thickness accuracy | E | E | P1 | E | E | P2 |

On the basis of these results, it can be seen that the resin composite that includes 65 to 99 parts by mass of the methacrylic resin (A), which contains no less than 80% by mass of a structural unit derived from methyl methacrylate and which has a melt viscosity η(A) of 1500 to 3500 Pa·s at 220° C. and at a shear rate of 122/sec, and 1 to 35 parts by mass of the triblock copolymer (B), which includes 40% to 70% by mass of the methacrylic acid ester polymer block (b2) and 30% to 60% by mass of the acrylic acid ester polymer block (b1) and which has a melt viscosity η(B) of 75 to 1500 Pa·s at 220° C. and at a shear rate of 122/sec, and of which the ratio (η(A)/η(B)) of the melt viscosity η(A) to the melt viscosity η(B) at 220° C. is from 1 to 20 excels in transparency, surface hardness, surface smoothness, and so on, experiences less whitening when being heated to a high temperature, and can be formed into a film or a molded product that excels in impact resistance. In addition, an article produced by using the laminated film of Example 1 had high specular glossiness.

This application claims priority to Japanese Patent Application No. 2015-043593, filed on Mar. 5, 2015 and Japanese Patent Application No. 2015-047535, filed on Mar. 10, 2015, and the entire disclosures of which are incorporated herein.

INDUSTRIAL APPLICABILITY

By taking advantage of its high handling properties, high surface smoothness, and high surface hardness, the molded product, the film, or the article according to the present invention is suitably used for a formed article requiring a sophisticated design or a formed article requiring advanced optical properties, such as signboard components including an advertising pillar, a stand signboard, a side signboard, a transom signboard, and a rooftop signboard; display components including a showcase, a divider panel, and a store display; illumination components including a fluorescent lamp cover, a mood lighting cover, a lamp shade, a luminous ceiling, a luminous wall, and a chandelier; interior design components including furniture, a pendant, and a mirror; construction components including a door, a dome, safety window glass, a partition, a staircase wainscot, a balcony wainscot, and a roof of a leisure building; transportation-related components including an airplane windshield, a pilot visor, a windshield for a motorcycle or a motorboat, a sun visor for a bus, a side visor for an automobile, a rear visor for an automobile, a head wing for an automobile, a head-light cover for an automobile, an automobile interior member, and an automobile exterior member such as a bumper; electronics components including a nameplate for an audio-visual system, a stereo cover, a protective mask for a television set, a vending machine, a cellular phone, and a personal computer; medical device-related components including an incubator and an X-ray part; device-related components including a machine cover, an instrument cover, an experimental device, a ruler, a dial, and an observation window; traffic-related components including a road sign, a direction board, a convex traffic mirror, and a highway noise barrier; a greenhouse, a large-sized tank, a box water tank, a bathroom member, a clock panel, a bath tub, a sanitary, a desk mat, a gaming machine component, a toy, a decorative and protective film for the surface of a face protection mask when welding or the like, and a wallpaper; a marking film; optics-related components including a liquid crystal protective film, a light guide film, a Fresnel's lens, a lenticular lens, front films of various displays, a diffusion film, a glass scattering prevention film, and a liquid crystal ASF film; and so on.

The invention claimed is:

1. A resin composite, comprising:
    65 to 99 parts by mass of a methacrylic resin (A) that comprises no less than 80% by mass of a structural unit derived from methyl methacrylate and that has a melt viscosity η(A) of 1500 to 3500 Pa·s at 220° C. and a shear rate of 122/sec; and
    1 to 35 parts by mass of a triblock copolymer (B) that comprises a methacrylic acid ester polymer block (b2) coupled to each of two ends of an acrylic acid ester polymer block (b1),
    wherein
    the triblock copolymer (B) includes 30% to 60% by mass of the acrylic acid ester polymer block (b1) and 40% to 70% by mass of the methacrylic acid ester polymer block (b2),
    the triblock copolymer (B) has a melt viscosity η(B) of 75 to 1500 Pa·s at 220° C. and a shear rate of 122/sec, and
    a ratio η(A)/η(B) of the melt viscosity η(A) to the melt viscosity η(B) is from 1 to 20.

2. The resin composite according to claim 1, wherein the methacrylic acid ester polymer blocks (b2) coupled to the respective ends of the acrylic acid ester polymer block (b1) have different mass percentages relative to a total mass percentage of the triblock copolymer (B), (b2(H)) is the block with a higher mass percentage, and (b2(L)) is the block with a lower mass percentage, and a ratio of the mass percentage of (b2(H)) to the mass percentage of the block (b2(L)) in the triblock copolymer (B), (b2(H))/(b2(L)), is no less than 1.3.

3. The resin composite according to claim 1, further comprising:

with respect to 100 parts by mass of the resin composite, 0.3 to 3 parts by mass of a processing aid that comprises no less than 60% by mass of a methyl methacrylate unit and no greater than 40% by mass of a vinyl-based monomer unit that is capable of being copolymerized with methyl methacrylate and has a mean degree of polymerization of 3,000 to 40,000.

4. A molded product, comprising:

a molding formed of the resin composite according to claim 1.

5. A film, comprising:

at least a resin film (R) formed of the resin composite according to claim 1.

6. The film according to claim 5, wherein the resin film (R) has a haze of no greater than 0.7%.

7. The film according to claim 5, wherein at least one surface of the resin film (R) has a surface roughness of no greater than 2.5 nm.

8. The film according to claim 5, wherein at least one surface of the resin film (R) has a pencil hardness of no lower than HB.

9. The film according to claim 5, wherein the resin film (R) has an impact resistance of no lower than 40 mJ.

10. The film according to claim 5, wherein printing is performed on at least one surface of the resin film (R).

11. The film according to claim 5, further comprising: at least one of (i) a layer made of metal and/or metal oxide, (ii) a thermoplastic resin layer, and (iii) a base material layer laminated on at least one surface of the resin film (R).

12. An article, comprising:

the film according to claim 5 provided on a surface of the article.

13. A method of producing a resin composite, the method comprising:

melt-compounding a resin composite that contains 65 to 99 parts by mass of a methacrylic resin (A) and 1 to 35 parts by mass of a triblock copolymer (B)

at a shear rate of 10/sec to 1000/sec and at a temperature of from 180° C. to 300° C., wherein the methacrylic resin (A) contains no less than 80% by mass of a structural unit derived from methyl methacrylate and has a melt viscosity $\eta(A)$ of 1500 to 3500 Pa·s at 220° C. and a shear rate of 122/sec;

the triblock copolymer (B) contains a methacrylic acid ester polymer block (b2) coupled to each of two ends of an acrylic acid ester polymer block (b1), where a content of the acrylic acid ester polymer block (b1) is 30% to 60% by mass and a content of the methacrylic acid ester polymer block (b2) is 40% to 70% by mass;

the triblock copolymer (B) has a melt viscosity $\eta(B)$ of 75 to 1500 Pa·s at 220° C. and a shear rate of 122/sec; and a ratio $\eta(A)/\eta(B)$ of the melt viscosity $\eta(A)$ to the melt viscosity $\eta(B)$ is from 1 to 20.

14. A method of producing a film, the method comprising:

extruding the resin composite according to claim 1 from a T-die, and pinching the resin composite by a mirror finish roll or belt, wherein a surface temperature of the mirror finish roll or belt is from 60° C. to 130°C.

* * * * *